(12) United States Patent
Kumano

(10) Patent No.: US 10,020,337 B2
(45) Date of Patent: Jul. 10, 2018

(54) PHOTOELECTRIC CONVERSION DEVICE, MANUFACTURING METHOD OF PHOTOELECTRIC CONVERSION DEVICE, AND IMAGING SYSTEM

(71) Applicant: CANON KABUSHIKI KAISHA, Tokyo (JP)

(72) Inventor: Hideomi Kumano, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/452,988

(22) Filed: Mar. 8, 2017

(65) Prior Publication Data

US 2017/0294472 A1 Oct. 12, 2017

(30) Foreign Application Priority Data

Apr. 6, 2016 (JP) .................. 2016-076380

(51) Int. Cl.
*H01L 31/00* (2006.01)
*H01L 27/146* (2006.01)

(52) U.S. Cl.
CPC .... *H01L 27/14636* (2013.01); *H01L 27/1462* (2013.01); *H01L 27/1464* (2013.01); *H01L 27/14607* (2013.01); *H01L 27/14625* (2013.01); *H01L 27/14685* (2013.01); *H01L 27/14627* (2013.01)

(58) Field of Classification Search
CPC ......... H01L 27/14636; H01L 27/14643; H01L 27/14627; H01L 27/14685

USPC ......................................... 257/459
See application file for complete search history.

(56) References Cited

U.S. PATENT DOCUMENTS

| 6,949,830 | B2 | 9/2005 | Owada et al. |
| 7,485,570 | B2 | 2/2009 | Owada et al. |
| 8,349,722 | B2 | 1/2013 | Owada et al. |
| 8,778,814 | B2 | 7/2014 | Owada et al. |
| 2005/0287790 | A1* | 12/2005 | Owada .................... C23C 16/30 |
| | | | 438/622 |
| 2008/0135732 | A1* | 6/2008 | Toumiya ........... H01L 27/14625 |
| | | | 250/208.1 |
| 2012/0252227 | A1 | 10/2012 | Owada et al. |
| 2015/0179867 | A1 | 6/2015 | Kimura et al. |

FOREIGN PATENT DOCUMENTS

| JP | 2004-172590 A | 6/2004 |
| JP | 2015-126000 A | 7/2015 |

* cited by examiner

*Primary Examiner* — Theresa T Doan
(74) *Attorney, Agent, or Firm* — Fitzpatrick, Cella, Harper & Scinto

(57) ABSTRACT

Provided is a photoelectric conversion device including: a semiconductor substrate having a photoelectric conversion unit; a first conductive layer formed over the semiconductor substrate; a first diffusion prevention layer formed over the first conductive layer; and a light guide that guides an incident light into the photoelectric conversion unit, in which the first diffusion prevention layer contains hydrogen atoms and carbon atoms, and a composition ratio of the hydrogen atoms is greater than or equal to 46 at % and less than or equal to 50 at %.

15 Claims, 8 Drawing Sheets

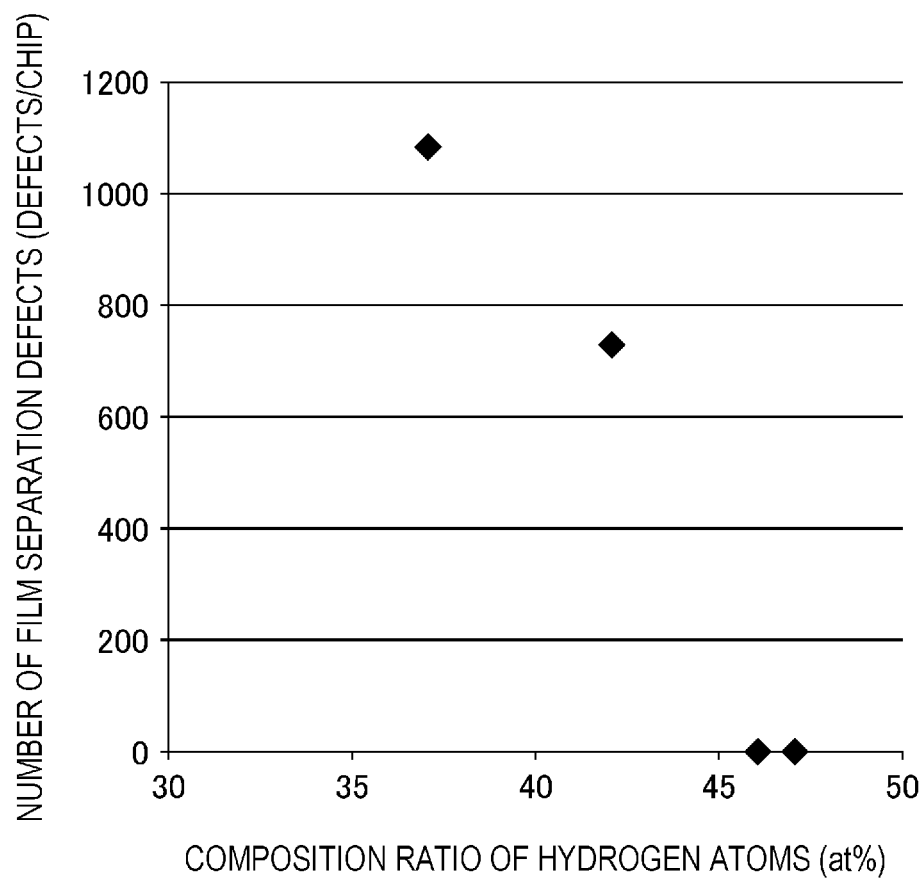

PHOTOELECTRIC CONVERSION DEVICE, MANUFACTURING METHOD OF PHOTOELECTRIC CONVERSION DEVICE, AND IMAGING SYSTEM

BACKGROUND OF THE INVENTION

Field of the Invention

The present invention relates to a photoelectric conversion device, a manufacturing method of the photoelectric conversion device, and an imaging system.

Description of the Related Art

Japanese Patent Application Laid-open No. 2015-126000 discloses a photoelectric conversion device in which a light guide is provided on a photoelectric conversion element. It is exemplified that a silicon nitride film formed by using high density plasma Chemical Vapor Disposition (CVD) method may be used for a high reflex index layer of a light guide.

Japanese Patent Application Laid-open No. 2004-172590 discloses wiring structure in which an interlayer insulating film with a low dielectric constant and a copper (Cu) wiring with a low resistance are used for reducing a delay due to the wiring. It is disclosed that a diffusion prevention film such as a silicon carbide or the like covering the copper wiring may be used for this wiring structure in order to prevent oxidation, diffusion, or the like of the copper.

Japanese Patent Application Laid-open No. 2015-126000 and Japanese Patent Application Laid-open No. 2004-172590 do not explicitly describe structure where the light guide is formed after a conductive layer and a diffusion prevention layer are formed. Such a configuration may have an object of reducing occurrence of film separation between the conductive layer and the diffusion prevention film in order to improve a yield ratio in manufacturing the photoelectric conversion device.

SUMMARY OF THE INVENTION

A photoelectric conversion device according to one embodiment of the present invention includes: a semiconductor substrate having a photoelectric conversion unit; a first conductive layer formed over the semiconductor substrate; a first diffusion prevention layer formed over the first conductive layer; and a light guide that guides an incident light into the photoelectric conversion unit, in which the first diffusion prevention layer contains hydrogen atoms and carbon atoms, and a composition ratio of the hydrogen atoms is greater than or equal to 46 at % and less than or equal to 50 at %.

A photoelectric conversion device according to one embodiment of the present invention includes: a semiconductor substrate having a photoelectric conversion unit; a second conductive layer formed over the semiconductor substrate; a second diffusion prevention layer formed over the second conductive layer; a first conductive layer formed over the second diffusion prevention layer; a first diffusion prevention layer formed over the first conductive layer; and a light guide that guides an incident light into the photoelectric conversion unit, in which each of the first diffusion prevention layer and the second diffusion prevention layer contains hydrogen atoms and carbon atoms, and a composition ratio of the hydrogen atoms of the first diffusion prevention layer is greater than a composition ratio of the hydrogen atoms of the second diffusion prevention layer.

A manufacturing method of a photoelectric conversion device according to one embodiment of the present invention includes: preparing a semiconductor substrate including a photoelectric conversion unit; forming a first conductive layer over the semiconductor substrate; forming a first diffusion prevention layer over the first conductive layer; and forming a light guide that guides an incident light into the photoelectric conversion unit, in which the first diffusion prevention layer contains hydrogen atoms and carbon atoms, and a composition ratio of the hydrogen atoms is greater than or equal to 46 at % and less than or equal to 50 at %.

Further features of the present invention will become apparent from the following description of exemplary embodiments with reference to the attached drawings.

BRIEF DESCRIPTION OF THE DRAWINGS

FIG. 5 is a graph illustrating a relationship between a composition ratio of hydrogen atoms and the number of defects in a diffusion prevention layer according to the first embodiment.

DESCRIPTION OF THE EMBODIMENTS

Preferred embodiments of the present invention will now be described in detail in accordance with the accompanying drawings. In the present specification, a depth direction of a substrate is defined as "under" direction and the direction opposite thereto is defined as "above/over/on" direction with respect to one primary surface of a semiconductor substrate on which devices are disposed. Further, in the present specification, "substrate" may refer not only to a complete semiconductor substrate where devices have been disposed but also to a substrate under a process or a substrate after a process for forming the devices.

First Embodiment

Structure and a manufacturing method of a photoelectric conversion device according to the first embodiment of the present invention will be described. Note that examples of the photoelectric conversion devices according to the present embodiment may include a solid state imaging device such as a CMOS image sensor or the like, a focus detection device for acquiring distance information used for focus position adjustment of a camera, and the like.

Figure 1A:
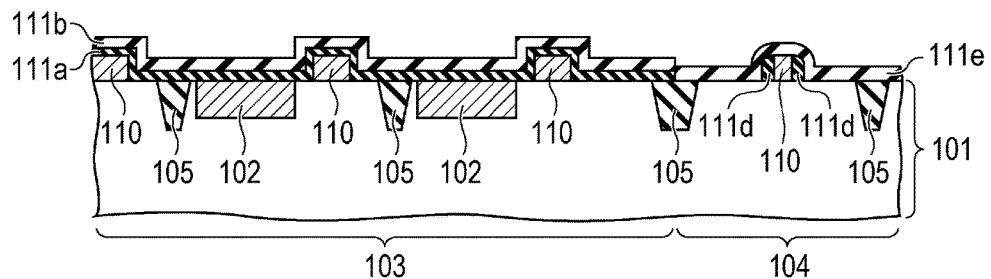
FIG. 1A, FIG. 1B, and FIG. 1C are schematic sectional views illustrating a manufacturing method of a photoelectric conversion device according to a first embodiment.

First, with reference to FIG. 1A, a process for preparing a semiconductor substrate 101 in which devices such as photoelectric conversion units 102 and the like of the photoelectric conversion device are formed will be described. A wafer such as a silicon may be used for the semiconductor substrate 101. On one primary surface of the semiconductor substrate 101, various semiconductor devices such as a MOS transistor, a bipolar transistor, a diode, a resistor element, a capacitor element, or the like may be formed. FIG. 1A illustrates a sectional view passing through the MOS transistors and the photoelectric conversion units 102 formed on the primary surface of the semiconductor substrate 101. Note that, in the following, description of some manufacturing processes that can be performed by using a general semiconductor manufacturing process may be simplified or omitted such as by describing the structure only.

FIG. 1A illustrates a pixel region 103 in which a plurality of photoelectric conversion units 102 are arranged and a peripheral region 104 in which a circuit for processing a signal from the photoelectric conversion units 102 are arranged. Each of the photoelectric conversion units 102 is a photoelectric conversion element that generates charges in accordance with an incident light and may be formed of a photodiode or the like formed inside the semiconductor substrate 101. Device isolation regions 105 each are formed between devices on the semiconductor substrate 101. Gate electrodes 110 are formed above the semiconductor substrate 101 via a gate insulating film (not illustrated). Interlayer insulating films 111a and 111b are formed in this order on the gate electrodes 110 in the pixel region 103. The interlayer insulating film 111a may be formed of a silicon nitride (SiN), a silicon oxide (SiO), or a stack film thereof. The interlayer insulating film 111b may contain a silicon nitride. Side spacers 111d are formed on the sides of the gate electrodes 110 in the peripheral region 104. An interlayer insulating film 111e is formed on the gate electrode 110 in the peripheral region 104. Side spacers 111d may be formed of a silicon nitride, a silicon oxide, or a stack film thereof. The interlayer insulating film 111e may be formed of a silicon nitride.

Figure 1B:
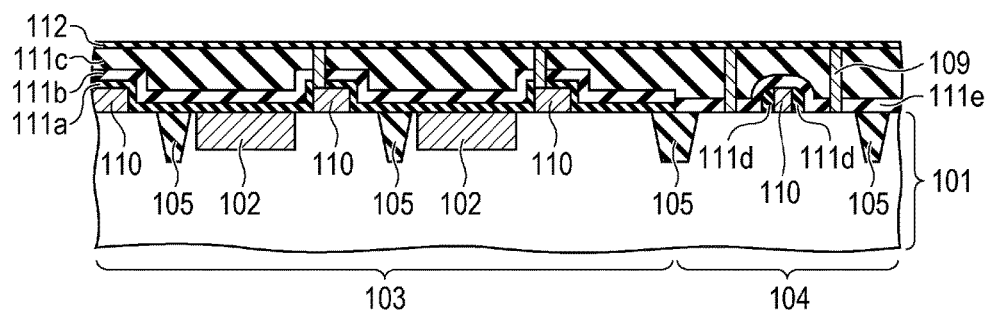

Next, with reference to FIG. 1B, a process for forming an interlayer insulating film 111c, contact plugs 109, and an etching stop layer 112 on the semiconductor substrate 101 will be described. After the completion of the process illustrated in FIG. 1A, the interlayer insulating film 111c that may contain a silicon oxide or the like is formed. Then, after contact holes penetrating the interlayer insulating films 111c and the like are formed, the contact plugs 109 are formed so as to be embedded in those contact holes. The primary material of the contact plugs 109 are a tungsten or the like, and each contact plug 109 has stack structure with a barrier metal made of a titanium, a titanium nitride, or the like at the boundary portion interfacing with the interlayer insulating film 111c and the like.

The etching stop layer 112 is then formed. The etching stop layer 112 functions as an etching stop layer for etching before forming a conductive layer 115a and a light guide forming film 116 in a process described later. The etching stop layer 112 is formed of a material containing hydrogen atoms (H) and carbon atoms (C). For example, the etching step layer 112 may include at least one of a silicon carbide (SiCH), a silicon carbide oxide (SiOCH), a silicon nitride carbide (SiCHN), a silicon nitride oxide (SiOHN), or the like that contains hydrogen atoms (H). It is desirable to increase the density by restricting a composition ratio of hydrogen atoms in the etching stop layer 112 (a ratio of hydrogen atoms of all the atoms in the material forming the etching stop layer 112) to be less than or equal to 46 at %. Thereby, a film having a higher etching selection ratio with respect to the interlayer insulating film 113a can be obtained allowing for a more effective etching stop function. From this point of view, it is desirable that the density of the etching stop layer 112 be greater than or equal to 2.0 g/cm$^3$, for example. However, the composition ratio and the density of hydrogen atoms in the etching stop layer 112 are not limited to the above. For example, the etching stop layer 112 may be substantially the same film as a diffusion prevention layer 114c described later. Note that "at %" denotes an atom percent.

The etching stop layer 112 may be formed by using a plasma CVD method, for example. The temperature during formation is set at 300 to 450 degrees Celsius, for example. Applied power is set to 800 to 1200 W for HF power at a frequency of 13.56 MHz and 500 to 1000 W for LF power at a frequency of 1 MHz or less, for example. A silicon-hydrogen-contained gas, a carbon-contained gas, or the like may be used for a source gas, for example. As used herein, the silicon-hydrogen-contained gas is a silane, a Tetraethyl orthosilicate (TEOS), a trimethylsilane, a tetramethylsilane, or the like, for example, and the carbon-contained gas is a carbon dioxide or the like, for example. In order to reduce the composition ratio of hydrogen atoms in the etching stop layer 112, the flow rate ratio of the silicon-hydrogen-contained gas to all the source gases is set less than or equal to 20%, for example.

Figure 1C:
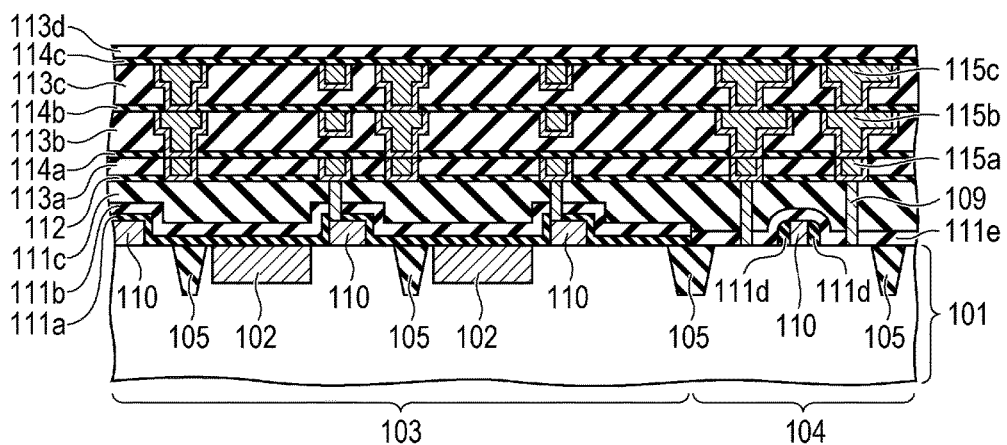

Next, with reference to FIG. 1C, a process forming a wiring layer whose primary conductive material is a copper (Cu) will be described. After the completion of the process illustrated in FIG. 1B, interlayer insulating films 113a to 113d, diffusion prevention layers 114a to 114c, and conductive layers 115a to 115c are formed. The conductive layers 115a to 115c are formed by embedding a copper or an alloy thereof in a groove pre-formed in the interlayer insulating films 113a to 113c, for example. Formation of these conductive layers 115a to 115c may be performed by using single damascene process, dual damascene process, or the like, for example. The conductive layer 115a is embedded in the interlayer insulating film 113a, and the conductive layer 115b is embedded in the interlayer insulating film 113b, and the conductive layer 115c is embedded in the interlayer insulating film 113c. In this case, the conductive layers 115a to 115c may have structure in which a barrier metal layer is formed around the copper wiring. The barrier metal layer may be formed of a titanium, a tantalum, a tantalum nitride, or the like, for example.

The interlayer insulating film 113a is formed on the etching stop layer 112. The diffusion prevention layer 114a is formed on the interlayer insulating film 113a, and the interlayer insulating film 113b is formed on the diffusion prevention layer 114a. The diffusion prevention layer 114b is formed on the interlayer insulating film 113b, and the interlayer insulating film 113c is formed on the diffusion prevention layer 114b. The diffusion prevention layer 114c is formed on the interlayer insulating film 113c, and the interlayer insulating film 113d is formed on the diffusion prevention layer 114c.

The diffusion prevention layers 114a, 114b, and 114c have a function of preventing or reducing diffusion of copper atoms, which are the wiring material, into the interlayer insulating films 113a, 113b, 113c, and 113d. The interlayer insulating films 113a, 113b, 113c, and 113d may be formed of a silicon oxide, a silicon carbide oxide (SiOC), or the like, for example. It is desirable for the interlayer insulating film 113d to be thinner within a range that can ensure a function of an interlayer insulating film for increasing the light concentration ratio and to have a film thickness of less than or equal to 500 nm, for example.

The diffusion prevention layers 114a and 114b (second diffusion prevention layers) respectively formed on the conductive layers 115a and 115b (second conductive layers) are formed of a material containing hydrogen atoms and carbon atoms. For example, the diffusion prevention layers 114a and 114b may include at least one of a silicon carbide (SiCH), a silicon carbide oxide (SiOCH), a silicon nitride carbide (SiCHN), or the like, which contains hydrogen atoms. It is desirable to increase the density by restricting the composition ratio of hydrogen atoms in the diffusion prevention layers 114a and 114b to be less than or equal to 46 at %. This improves the resistance to oxidation of a copper surface and the function of preventing or reducing diffusion of the copper due to the diffusion prevention layers 114a and 114b. The density of the diffusion prevention layers 114a and 114b is set greater than or equal to 2.0 g/cm$^3$, for example. However, the composition ratio and the density of hydrogen atoms in the diffusion prevention layers 114a and 114b are not limited to the above. For example, the diffusion prevention layers 114a and 114b may be substantially the same film as the diffusion prevention layer 114c described later.

The diffusion prevention layers 114a and 114b may be formed by using a plasma CVD method, for example. The temperature during formation is set at 300 to 450 degrees Celsius, for example. Applied power is set to 800 to 1200 W for HF power at a frequency of 13.56 MHz and 500 to 1000 W for LF power at a frequency of 1 MHz or less, for example. A silicon-hydrogen-contained gas or a carbon-contained gas may be used for a source gas, for example. As used herein, the silicon-hydrogen-contained gas is a silane, a Tetraethyl orthosilicate (TEOS), a trimethylsilane, a tetramethylsilane, or the like, and the carbon-contained gas is a carbon dioxide or the like, for example. In order to reduce the composition ratio of hydrogen atoms in the diffusion prevention layers 114a to 114b, the flow rate ratio of the silicon-hydrogen-contained gas to all the source gases is set less than or equal to 20%, for example.

The diffusion prevention layer 114c (first diffusion prevention layer) formed on the conductive layer 115c (first conductive layer) is formed of a material containing hydrogen atoms and carbon atoms. The diffusion prevention layer 114c may include at least one of a silicon carbide (SiCH), a silicon carbide oxide (SiOCH), a silicon nitride carbide (SiCHN), or the like, which contains hydrogen atoms. The diffusion prevention layer 114c is formed by using a plasma CVD method, for example, in a similar manner to the diffusion prevention layers 114a and 114b. The conditions during formation is the same as those for the diffusion prevention layers 114a and 114b described above except the flow rate ratio of the silicon-hydrogen-contained gas. It is desirable that the composition ratio of hydrogen atoms in the diffusion prevention layer 114c be greater than or equal to 46 at % and less than or equal to 50 at % in order to reduce film separation, which will be described in detail below. Further, in view of the desirable composition ratio of hydrogen atoms in the diffusion prevention layers 114a and 114b being greater than or equal to 46 at % as described above, it is desirable that the composition ratio of hydrogen atoms in the diffusion prevention layer 114c be greater than the composition ratio of hydrogen atoms in the diffusion prevention layers 114a and 114b. For the same reason, it is desirable that the density of the diffusion prevention layer 114c be less than the density of the diffusion prevention layers 114a and 114b. The flow rate ratio of the silicon-hydrogen-contained gas is, for example, 20% to 40% of all the source gases in order to increase the composition ratio of the hydrogen atoms in the diffusion prevention layer 114c.

Figure 2A:
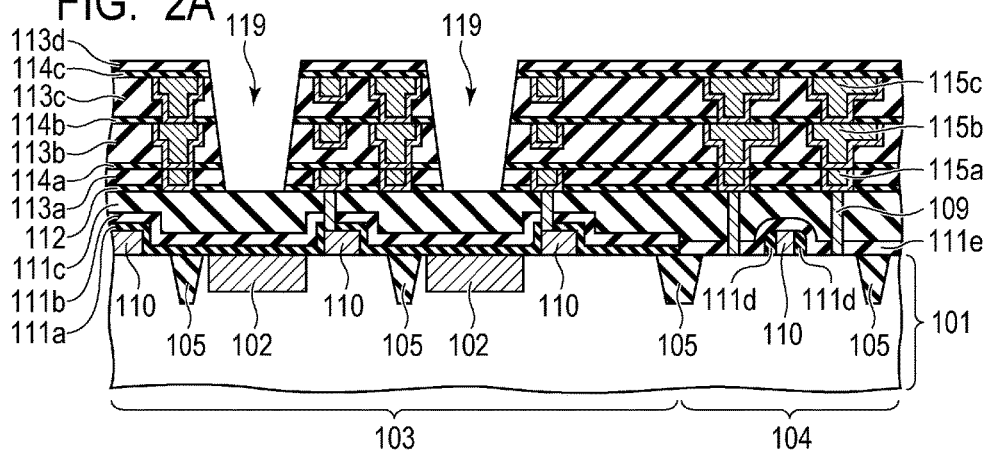
FIG. 2A, FIG. 2B, and FIG. 2C are schematic sectional views illustrating the manufacturing method of the photoelectric conversion device according to the first embodiment.

Next, with reference to FIG. 2A, FIG. 2B, and FIG. 2C, a process for forming light guides 118 above the photoelectric conversion units 102 will be described. First, as illustrated in FIG. 2A, openings 119 are formed by etching the interlayer insulating films 113a to 113d and the diffusion prevention layers 114a to 114c in the regions right above the photoelectric conversion units 102, each in a frustoconical shape, by using the etching stop layer 112 as a stop layer. A plasma etching method may be used for the above etching method, for example.

Figure 2B:
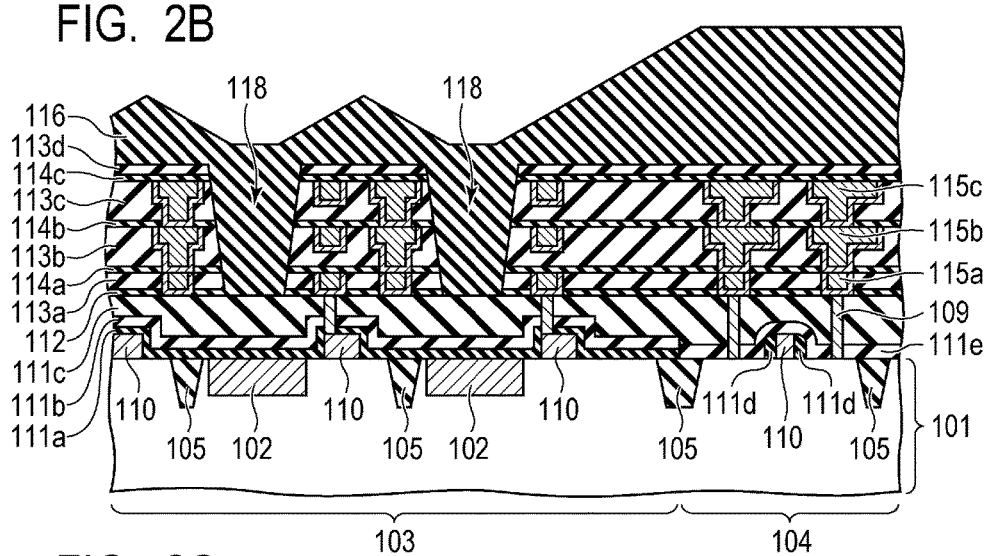
Figure 2C:
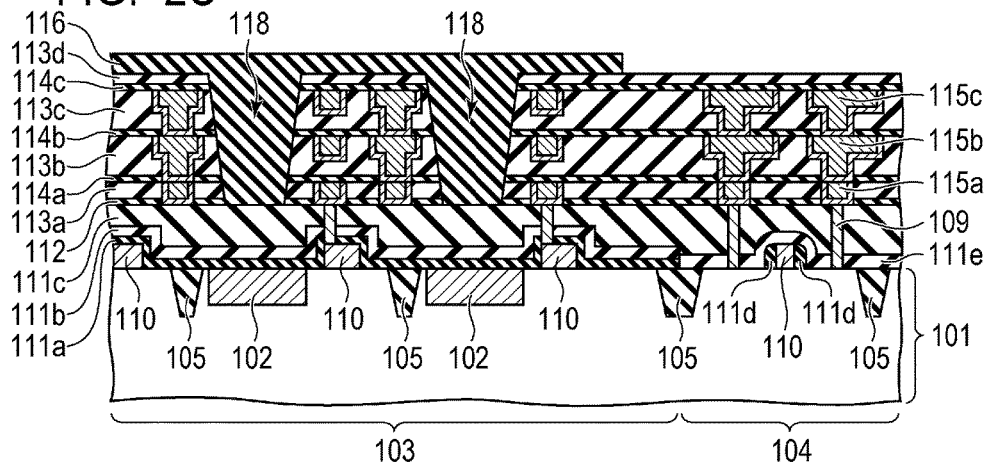

Then, as illustrated in FIG. 2B, a light guide forming film 116 is embedded in the openings 119 by depositing the light guide forming film 116 by using a plasma CVD method, for example. Thereby, each light guide 118 is formed above each photoelectric conversion unit 102. Each light guide 118 has a function of guiding an incident light to each photoelectric conversion unit 102. For the light guide forming film 116, a silicon nitride or the like may be used, which is a material whose reflex index is greater than that of the surrounding interlayer insulating film or the like. Next, as illustrated in FIG. 2C, the light guide forming film 116 is grinded by using a CMP method, for example, to remove the light guide forming film 116 above the conductive layer 115c in the peripheral region 104. In such a way, the light guides 118 are completed. Note that the length in the light incident direction of the light guide 118 is defined in accordance with the thicknesses of the conductive layer, the interlayer insulating film, and the like. Typically, the length in the light incident direction of the light guide 118 may often be greater than or equal to 1 μm for ensuring the functions of the conductive layer and the interlayer insulating film, and therefore the film thickness of the light guide forming film 116 may often be greater than or equal to 1 μm.

Figure 3A:
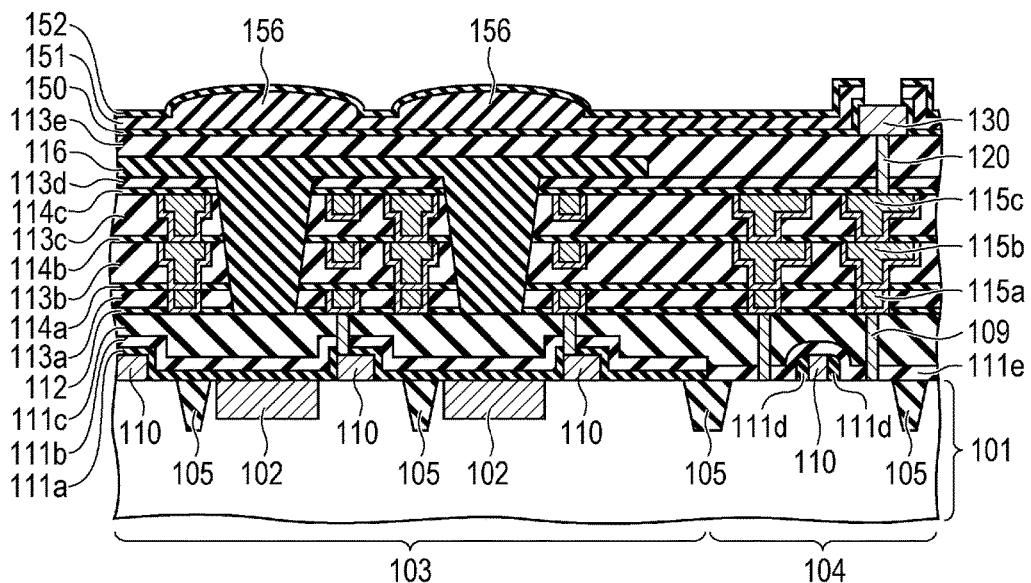
FIG. 3A and FIG. 3B are schematic sectional views illustrating the manufacturing method of the photoelectric conversion device according to the first embodiment.

Next, with reference to FIG. 3A and FIG. 3B, a process for forming inner-layer lenses 156, color filters 154, and micro lenses 155 over the light guides 118 will be described. First, as illustrated in FIG. 3A, an interlayer insulating film 113e is formed on the light guide forming film 116 and over the interlayer insulating film 113d. The interlayer insulating film 113e may be formed of a silicon oxide formed by using a plasma CVD method, for example. Next, a plug 120 is formed so as to penetrate the interlayer insulating films 113d and 113e, and a conductive layer 130 is formed thereon. The plug 120 electrically connects the conductive layer 130 to the conductive layer 115c. The plug 120 may be formed of a tungsten as a primary material, for example. The plug 120 may have a titanium, a titanium nitride, or the like as a barrier metal. The conductive layer 130 may be formed of an aluminum as a primary material, for example.

Next, the inner-layer lenses 156 are formed on the interlayer insulating film 113e. The inner-layer lenses 156 are formed over the light guides 118 correspondingly to the photoelectric conversion units 102. The inner-layer lenses 156 are formed including insulating layers 150, 151, and 152 in this order. The insulating layer 150 may be made of a silicon nitride oxide, for example, and formed on the interlayer insulating film 113e by using a plasma CVD method or the like. The insulating layer 151 may be made of a silicon nitride, for example, and formed on the insulating film 150 by using a plasma CVD method or the like. After the formation of the insulating layer 151, a lens-shaped photoresist is formed on the insulating layer 151, etching is performed by using this photoresist as a mask, and thereby a part of the insulating layer 151 can be formed in a lens shape. The insulating layer 152 may be made of a silicon nitride oxide, for example, and formed on the insulating film 151 by using a plasma CVD method or the like. The insulating layers 150 and 152 function as an anti-reflection film of the insulating layer 151. Providing the inner-layer lenses 156 can cause more incident light to enter the photoelectric conversion units 102.

Next, in order to reduce an interface state at the interface between the silicon and the silicon oxide film, a heat treatment is performed in an air containing a hydrogen gas. Thereby, the silicon dangling bond can be terminated by a hydrogen. The temperature of the heat treatment is around 400 degrees Celsius, for example.

Figure 3B:
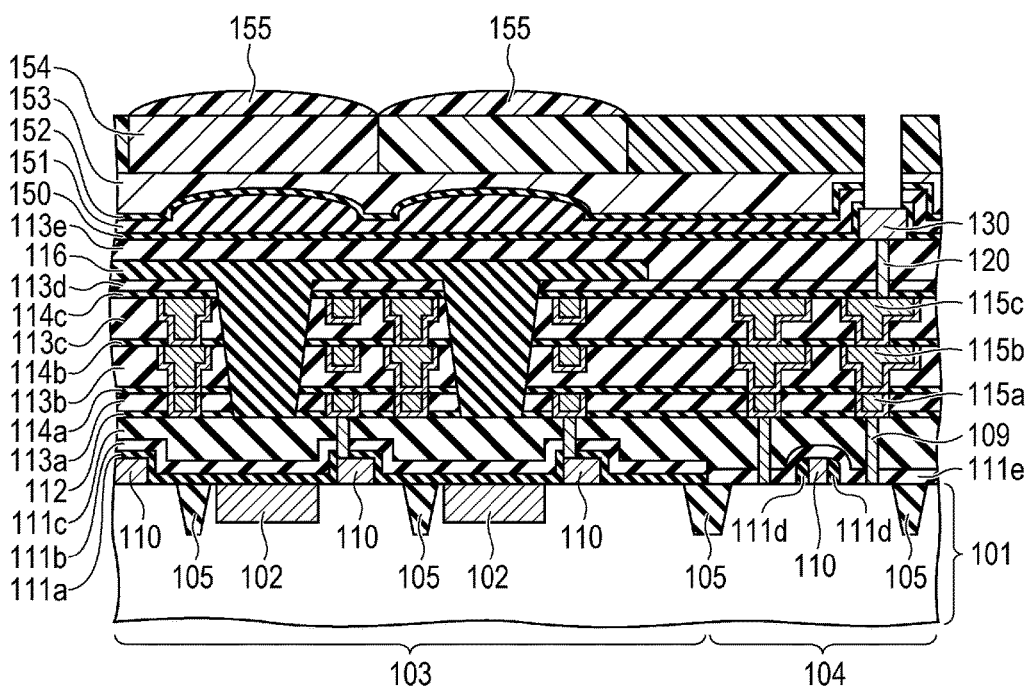

Next, as illustrated in FIG. 3B, a smoothing layer 153, a color filter 154, and a micro lens 155 are formed in this order. The smoothing layer 153 may be formed of a resin, for example. The smoothing layer 153 allows for absorption of the unevenness due to the inner-layer lenses 156 to obtain a smooth surface. The color filter 154 is formed of a material having a plurality of different colors in accordance with the associated photoelectric conversion units 102. This enables the photoelectric conversion device to perform a color capturing. When the photoelectric conversion device is for a monochrome type, a three-plate type camera, or the like, however, the color filter 154 can be omitted. The micro lenses 155 may be formed of a resin, for example. Each micro lens 155 is a lens provided associated with each of the photoelectric conversion units 102, and this can cause more incident light to enter the photoelectric conversion units 102.

Figure 4A:
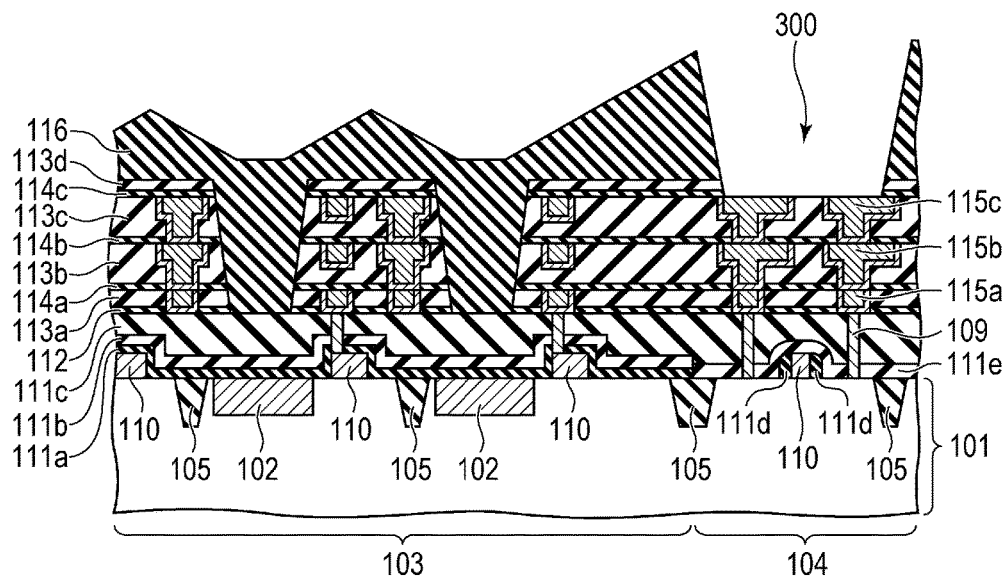
FIG. 4A and FIG. 4B are views illustrating film separation in a manufacturing process of the photoelectric conversion device according to the first embodiment.
Figure 4B:
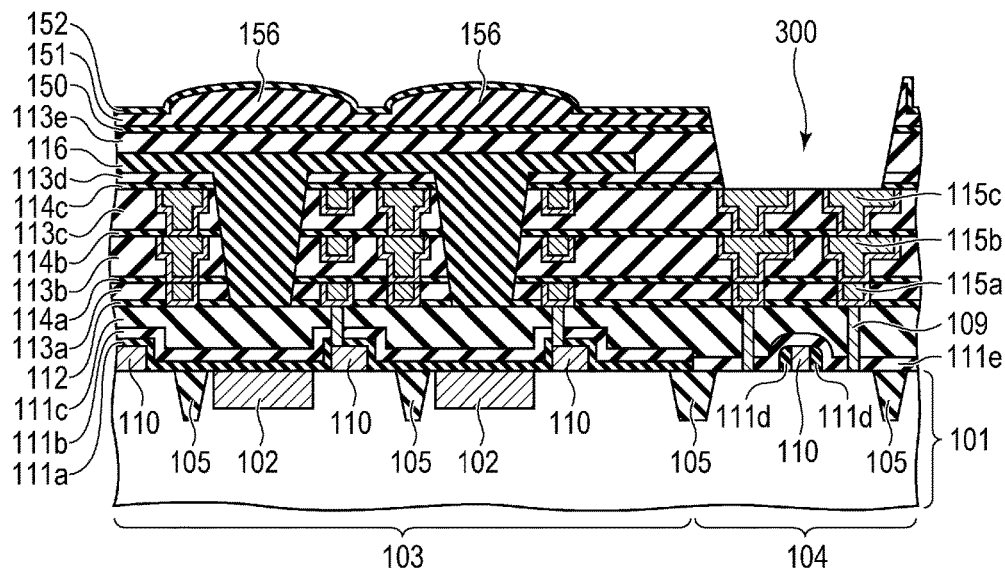

Next, advantages of the configuration of the present embodiment will be described. First, with reference to FIG. 4A and FIG. 4B, film separation which can be reduced by the configuration of the present embodiment will be described. In FIG. 4A and FIG. 4B are views illustrating film separation in the manufacturing process of the photoelectric conversion device according to the first embodiment.

First, with reference to FIG. 4A, a first situation of film separation will be described. This situation is of film separation which may be caused after deposition of the light guide forming film 116 described with reference to FIG. 2B. The light guide forming film 116 may have a high compressive stress of a range of 100 MPa to 600 MPa, for example. Further, in order to completely embed the light guide forming film 116 in the openings 119 to form the light guide, it is necessary to deposit the light guide forming film 116 having a film thickness of 1 μm or greater, typically, around 2 μm. Because of formation of the thick light guide forming film 116, layers under the light guide forming film 116 are subjected to a large stress. Since the light guide forming film 116 is formed over the entire surface of the substrate, the light guide forming film 116 such the film thickness is formed above the diffusion prevention layer 114c of the peripheral region 104. The diffusion prevention layer 114c is located closer to the light guide forming film 116 than the diffusion prevention layers 114a and 114b are, and the diffusion prevention layer 114c is therefore subjected to more influence of the stress from the light guide forming film 116.

Therefore, as illustrated in FIG. 4A, immediately after the deposition of the light guide forming film 116, film separation may occur at a film separation occurrence portion 300 at the interface between the conductive layer 115c and the diffusion prevention layer 114c. Even if no film separation occurs immediately after the deposition of the light guide forming film 116, the interface between the conductive layer 115c and the diffusion prevention layer 114c is likely to be a starting point of film separation in subsequent processes.

Next, with reference to FIG. 4B, a second situation of film separation will be described. This situation is of film separation which may occur at the heat treatment for reducing the interface state at the interface between the silicon and the silicon oxide film as described with reference to FIG. 3A. Such a heat treatment causes a thermal stress in the semiconductor substrate 101. Also in this case, film separation may occur starting from the interface between the conductive layer 115c and the diffusion prevention layer 114c.

Occurrence of film separation as described above may cause a particle due to the separated film. If this particle attaches on the substrate, this may cause a reduction of the yield rate of the product. Further, if the copper forming the conductive layers 115a, 115b, and 115c is exposed due to the film separation and the manufacturing apparatus is contaminated with the copper, this may affect other products manufactured by using the manufacturing apparatus such as degrade the quality thereof.

The photoelectric conversion device according to the present embodiment suppresses or reduces occurrence of film separation at the interface between the conductive layer 115c and the diffusion prevention layer 114c described above. This can improve the yield rate in the manufacturing of the photoelectric conversion device. Suppression or reduction of film separation will be described in detail below with reference to experimental data. Note that the material of the diffusion prevention layer 114c is a silicon carbide (SiCH) in the experimental data described below.

FIG. 5 is a graph illustrating a relationship between the composition ratio of hydrogen atoms in the diffusion prevention layer 114c and the number of defects due to film separation at the interface between the conductive layer 115c and the diffusion prevention layer 114c. The horizontal axis denotes the composition ratio (at %) of hydrogen atoms, and vertical axis denotes the number of defects (defects/chip) due to film separation. The composition ratio was measured by using Rutherford Backscattering Spectrometry (RBS) or Elastic Recoil Detection Analysis (ERDA). According to FIG. 5, while a significant amount of film separation occurs when the composition ratio of hydrogen atoms is around 37% and around 42%, no film separation occurs when the composition ratio of hydrogen atoms is around 46% and around 47%. That is, it is understood that film separation is suppressed by composition ratio of hydrogen atoms being greater than or equal to around 46%. On the other hand, it is desirable that the composition ratio of hydrogen atoms in the diffusion prevention layer 114c be less than or equal to 50 at %. As described later, with 50 at % or less of the composition ratio of hydrogen atoms in the diffusion prevention layer 114c, the film stress of the diffusion prevention layer 114c becomes a compressive stress. Thereby, film separation of the diffusion prevention layer 114c can be suppressed.

Figure 6:
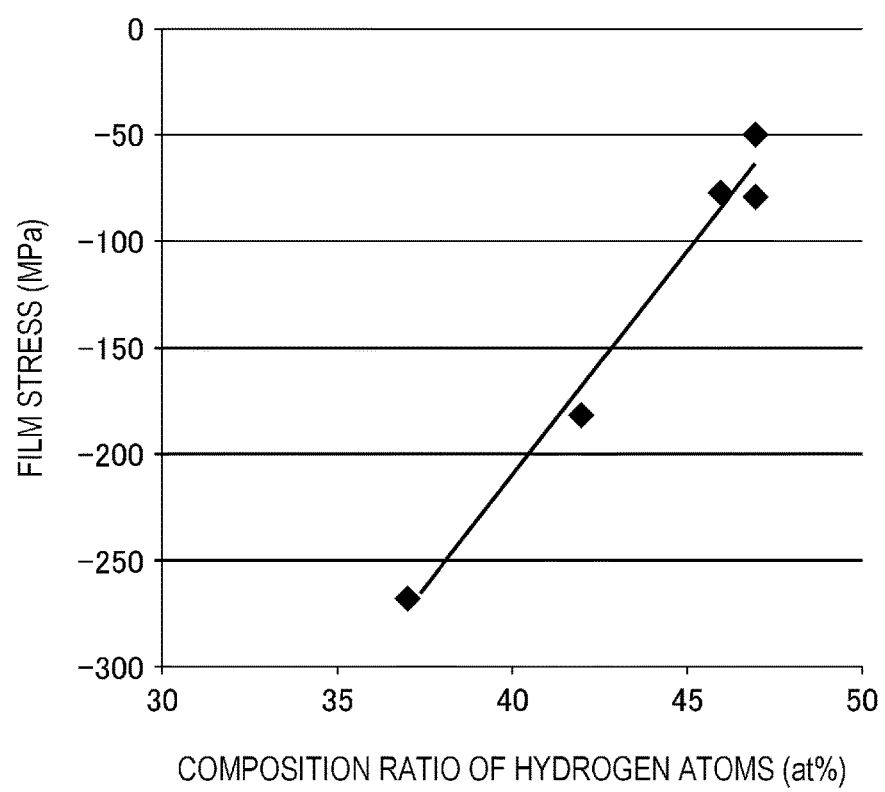
FIG. 6 is a graph illustrating a relationship between a composition ratio of hydrogen atoms and a film stress in a diffusion prevention layer according to the first embodiment.

FIG. 6 is a graph illustrating a relationship between the composition ratio of hydrogen atoms in the diffusion prevention layer 114c and the film stress of the diffusion prevention layer 114c. The horizontal axis denotes the composition ratio (at %) of hydrogen atoms, and vertical axis denotes the film stress (MPa). Note that, regarding the sign of the film stress in this graph, a tensile stress corresponds to the positive and a compressive stress corresponds to the negative. Note that the film stress was calculated by measuring the difference of the degree of warp of the silicon wafer before and after forming a silicon carbide film on the silicon wafer. The measurement of warp can be performed by placing a silicon wafer on a stage of an optical measurement system and measuring the position in the Z-direction (the position in the thickness direction of the silicon wafer) which is in focus on the silicon wafer surface for a plurality of measuring points within the silicon wafer surface. The plurality of measuring points within the silicon wafer surface may be multiple measuring points on a line traversing vertically or horizontally in a surface direction of the silicon wafer, for example.

As the composition ratio of hydrogen atoms in the diffusion prevention layer 114c increases, the film stress of the diffusion prevention layer 114c changes in the positive direction, that is, the compressive stress of the diffusion prevention layer 114c decreases. The reason is supposed to be that, as the composition ratio of hydrogen atoms in the diffusion prevention layer 114c increases, the density of the diffusion prevention layer 114c decreases. According to the data of FIG. 6, for all the data points when the composition ratio of hydrogen atoms in the diffusion prevention layer 114c is around 46 at % or greater, the compressive stress of the diffusion prevention layer 114c is less than or equal to 80 MPa. On the other hand, it is desirable that the film stress of the diffusion prevention layer 114c not be a tensile stress, that is, be a compressive stress of greater than or equal to 0 MPa. In this regard, it is desirable that the film stress be within a range of a compressive stress because a film stress within a range of a tensile stress may cause film separation. Therefore, it is desirable for the diffusion prevention layer 114c to be subjected to a compressive stress that is greater than or equal to 0 MPa and less than or equal to 80 MPa. The line of FIG. 6 is an approximate line obtained by a least squares method for the data points. The line of FIG. 6 is expressed as y=20.935x−1047.2, where the composition ratio of hydrogen atoms in the horizontal axis is denoted as x and the film stress in the vertical axis is denoted as y. From this equation, the composition ratio of hydrogen atoms when the film stress is zero is 50.0215%, that is, around 50%. Thus, with the composition ratio of hydrogen atoms in the diffusion prevention layer 114c being less than or equal to 50 at %, the film stress of the diffusion prevention layer 114c becomes a compressive stress and therefore film separation can be suppressed.

Figure 7:
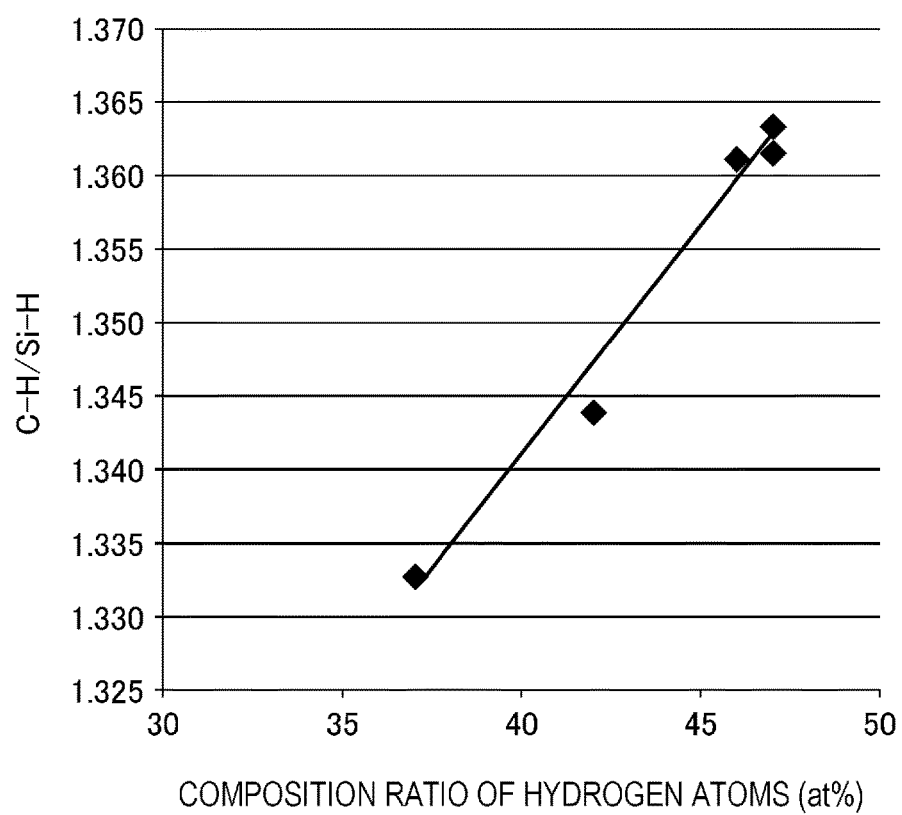
FIG. 7 is a graph illustrating a relationship between a composition ratio of hydrogen atoms and a presence ratio of C—H bonding/Si—H bonding in a diffusion prevention layer according to the first embodiment.

FIG. 7 is a graph illustrating a relationship between the composition ratio of hydrogen atoms in the diffusion prevention layer 114c and the presence ratio of C—H bonding to Si—H bonding (C—H/Si—H) in the material forming the diffusion prevention layer 114c. The horizontal axis denotes the composition ratio (at %) of hydrogen atoms, and the vertical axis denotes C—H/Si—H. The C—H/Si—H was calculated based on an absorption spectrum measured by using Fourier Transform Infrared Spectroscopy (FTIR). In the absorption spectrum, the peak near the wave number of 2200 to 2300 cm$^{-1}$ corresponds to stretching vibration of the Si—H bonding, and the peak near the wave number of 3000 cm$^{-1}$ corresponds to stretching vibration of the C—H bonding. By calculating the ratio of the areas of these peaks, the presence ratio of C—H bonding to Si—H bonding can be obtained. FIG. 7 indicates that the higher the composition ratio of hydrogen atoms in the diffusion prevention layer 114c is, the higher the ratio of C—H bonding is. According to the data of FIG. 7, the C—H/Si—H is greater than or equal to 1.36 for all the data points where the composition ratio of hydrogen atoms in the diffusion prevention layer 114c is around 46 at % or greater. The line of FIG. 7 is an approximate line obtained by a least squares method for the data points. The line of FIG. 7 is expressed as y=0.0031x+1.2165, when the composition ratio of hydrogen atoms in the horizontal axis is denoted as x and the C—H/Si—H in the vertical axis is denoted as y. From this equation, the C—H/Si—H when the film stress is zero, that is, the hydrogen composition ratio is 50% is 1.3715, namely, around 1.37. Thus, with C—H/Si—H being less than or equal to 1.37, the film stress of the diffusion prevention layer 114c becomes a compressive stress and therefore film separation can be suppressed. For the above reason, it is desirable to form the diffusion prevention layer 114c such that the C—H/Si—H is greater than or equal to 1.36 and less than or equal to 1.37.

According to FIG. 5 to FIG. 7 described above, an increase of the composition ratio of hydrogen atoms in the diffusion prevention layer 114c causes an increase of C—H bonding and a reduction of the compressive stress in the diffusion prevention layer 114c. It is thus supposed that occurrence of film separation was reduced due to improvement of adhesion between the conductive layer 115c and the diffusion prevention layer 114c or due to a reduction in the stress applied at the junction thereof. The photoelectric conversion device has the structure where film separation between the conductive layer 115c and the diffusion prevention layer 114c would otherwise be likely to occur due to having the light guides 118 and the like. According to the present embodiment, film separation can be reduced even in the photoelectric conversion device having such the structure. This can improve the yield rate in manufacturing the photoelectric conversion device. Therefore, lower-cost photoelectric conversion devices can be provided. Further, the present embodiment can reduce occurrence of the problem in which the manufacturing apparatus is contaminated due to film separation and thereby the quality of other devices is affected.

Second Embodiment

Figure 8:
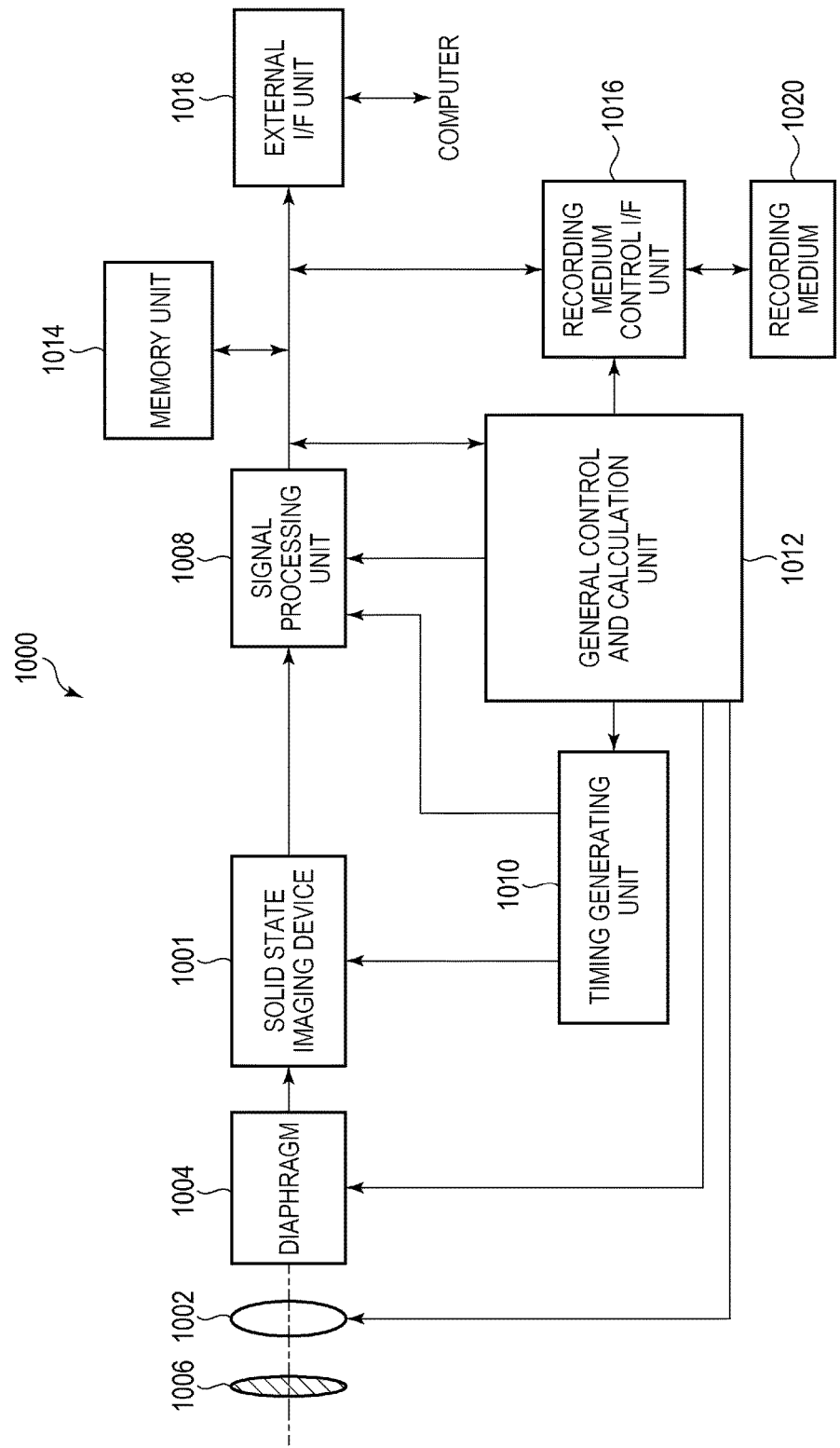
FIG. 8 is a block diagram of an imaging system according to a second embodiment.

An imaging system according to a second embodiment of the present invention will be described by using FIG. 8. FIG. 8 is a block diagram illustrating a general configuration of the imaging system according to the present embodiment. The imaging system 1000 of the present embodiment has a solid state imaging device 1001 that is an example of the photoelectric conversion device according to the first embodiment.

The imaging system 1000 of the present embodiment may be applied to, though not limited to in particular, a digital still camera, a digital camcorder, a camera head, a copier machine, a fax machine, a mobile phone, an on-vehicle camera, an observation satellite, or the like, for example.

As illustrated in FIG. 8, the imaging system 1000 has a solid state imaging device 1001, a lens 1002, a diaphragm 1004, a barrier 1006, a signal processing unit 1008, a timing generating unit 1010, and a general control and calculation unit 1012. The imaging system 1000 further has a memory unit 1014, a recording medium control I/F unit 1016, and an external I/F unit 1018.

The lens 1002 is for capturing an optical image of an object on a pixel area of the solid state imaging device 1001. The diaphragm 1004 is for changing the light amount passing through the lens 1002. The barrier 1006 is for protection of the lens 1002. The solid state imaging device 1001 is the photoelectric conversion device described in the first embodiment and outputs, to the signal processing unit 1008, a signal based on an optical image captured by the lens 1002.

The signal processing unit 1008 performs desired processes, correction, data compression, or the like on a signal output from the solid state imaging device 1001. The signal processing unit 1008 includes an analog-to-digital converter that converts an analog signal output from the solid state imaging device 1001 into a digital signal and a digital signal processor that processes the digital signal output from the analog-to-digital converter. The signal processing unit 1008 may be mounted on the same substrate as the solid state imaging device 1001, or may be mounted on a separate substrate. Further, a part of the functions of the signal processing unit 1008 may be mounted on the same substrate as the solid state imaging device 1001 and the other part of the functions of the signal processing unit 1008 may be mounted on a separate substrate.

The timing generating unit 1010 is for outputting various timing signals to the solid state imaging device 1001 and the signal processing unit 1008. The general control and calculation unit 1012 is a control unit that controls the entire drive and/or calculation process of the imaging system 1000. In this configuration, a timing signal or the like may be input from the outside of the imaging system 1000, and the imaging system 1000 may be any imaging system as long as it includes at least the solid state imaging device 1001 and the signal processing unit 1008 that processes a signal output from the solid state imaging device 1001.

The memory unit 1014 is a frame memory unit for temporarily storing image data. The recording medium control I/F unit 1016 is an interface unit that performs recording to a recording medium 1020 or readout from the recording medium 1020. The external I/F unit 1018 is an interface unit that communicates with an external computer or the like. The recording medium 1020 is a removable storage medium such as a semiconductor memory for performing recording or readout of captured data or a storage medium built in the imaging system 1000.

In such a way, the imaging system 1000 can be configured by employing the solid state imaging device 1001 that is an example of the photoelectric conversion device according to the first embodiment. Since the photoelectric conversion device according to the first embodiment has an advantage that improves the yield rate in manufacturing of the photoelectric conversion device according to the first embodiment, a lower-cost imaging system can be realized.

Other Embodiments

While the multilayer wiring structure having three conductive layers is illustrated in the first embodiment, the embodiment is not limited thereto. Any number of conductive layers may be selected.

Further, the imaging system illustrated in the second embodiment is a mere example of imaging systems to which the imaging device of the present invention can be applied, and imaging systems to which the photoelectric conversion device of the present invention is applicable are not limited to the configuration illustrated in FIG. 8. For example, the imaging system may be configured by using the photoelectric conversion device of the first embodiment as a focus detection device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-076380, filed Apr. 6, 2016, which is hereby incorporated by reference herein in its entirety.

What is claimed is:

1. A photoelectric conversion device comprising:
   a semiconductor substrate having a photoelectric conversion unit;
   a first conductive layer formed over the semiconductor substrate;
   a first diffusion prevention layer formed over the first conductive layer; and
   a light guide that guides an incident light into the photoelectric conversion unit,
   wherein the first diffusion prevention layer contains hydrogen atoms and carbon atoms, and a composition ratio of the hydrogen atoms is 46 at % to 50 at %.

2. The photoelectric conversion device according to claim 1, wherein the first diffusion prevention layer contains at least one selected from a group consisting of a silicon carbide containing hydrogen atoms, a silicon carbide oxide containing hydrogen atoms, and a silicon nitride carbide containing hydrogen atoms.

3. The photoelectric conversion device according to claim 1, wherein a presence ratio of C—H bonding to Si—H bonding of the first diffusion prevention layer is 1.36 to 1.37.

4. The photoelectric conversion device according to claim 1, wherein the first diffusion prevention layer is a film having a compressive stress of 0 MPa to 80 MPa.

5. The photoelectric conversion device according to claim 1, wherein a film forming the light guide contains a silicon nitride.

6. The photoelectric conversion device according to claim 1, wherein the light guide has a length of greater than or equal to 1 µm in a light incident direction.

7. The photoelectric conversion device according to claim 1, wherein a film forming the light guide is a film having a compressive stress of 100 MPa to 600 MPa.

8. The photoelectric conversion device according to claim 1, further comprising an interlayer insulating film formed over the first diffusion prevention layer,
   wherein a film thickness of the interlayer insulating film is less than or equal to 500 nm.

9. The photoelectric conversion device according to claim 1, wherein the first conductive layer contains a copper.

10. The photoelectric conversion device according to claim 1, further comprising:
    a second conductive layer formed over the semiconductor substrate and under the first conductive layer; and
    a second diffusion prevention layer formed over the second conductive layer and under the first conductive layer and containing hydrogen atoms and carbon atoms.

11. The photoelectric conversion device according to claim 10, wherein the second diffusion prevention layer contains at least one selected from a group consisting of a silicon carbide containing hydrogen atoms, a silicon carbide oxide containing hydrogen atoms, and a silicon nitride carbide containing hydrogen atoms.

12. The photoelectric conversion device according to claim 10, wherein the composition ratio of the hydrogen atoms of the first diffusion prevention layer is greater than a composition ratio of the hydrogen atoms of the second diffusion prevention layer.

13. The photoelectric conversion device according to claim 10, wherein a density of the first diffusion prevention layer is less than a density of the second diffusion prevention layer.

14. The photoelectric conversion device according to claim 10, wherein the second conductive layer contains a copper.

15. An imaging system comprising:
the photoelectric conversion device according to claim 1; and
a signal processing unit that processes a signal output from the photoelectric conversion device.

* * * * *